United States Patent [19]
Barbu et al.

[11] Patent Number: 5,329,279
[45] Date of Patent: Jul. 12, 1994

[54] METHOD OF TRANSCODING DATA FROM A THERMOMETRIC CODE, DECODER AND CONVERTER APPLYING THIS METHOD

[75] Inventors: Stéphane Barbu; Laurent LePailleur, both of Caen, France

[73] Assignee: U.S. Philips Corporation, New York, N.Y.

[21] Appl. No.: 947,665

[22] Filed: Sep. 18, 1992

[30] Foreign Application Priority Data

Sep. 20, 1991 [FR] France .......................... 91 11645
Sep. 20, 1991 [FR] France .......................... 91 11644

[51] Int. Cl.$^5$ .............................................. H03M 7/14
[52] U.S. Cl. ........................................ 341/50; 341/160
[58] Field of Search ................... 341/50, 94, 96, 97, 341/98, 160

[56] References Cited
U.S. PATENT DOCUMENTS

| | | | |
|---|---|---|---|
| 4,586,025 | 4/1986 | Knierim | 341/160 |
| 4,733,220 | 3/1988 | Knierim | 341/160 |
| 4,897,656 | 1/1990 | van de Plassche et al. | 341/156 |
| 5,119,098 | 6/1992 | Komatsu et al. | 341/160 X |
| 5,243,348 | 9/1993 | Jackson | 341/160 |

*Primary Examiner*—Howard L. Williams
*Attorney, Agent, or Firm*—Bernard Franzblau

[57] ABSTRACT

A method of transcoding digital data which, at the start, appear in the form of a thermometric code, the successive values of which may be represented by a first bit matrix (columns 1 to 8). The method uses an intermediate code defined by a second matrix (low significance), (columns (1), (2), (3) and (4)), and by a third matrix (high significance), (columns 4 and 8), which is extracted from the first matrix. The intermediate code delivers digital words which are shorter than the starting words and permits a later transformation into a binary code (columns [1], [2], [3], [4],) which is very simple. A decoder and a converter using this method is described where the decoder is organized so as to first produce the values of the intermediate code and then, the corresponding values in binary code. The converter employs analog gates with multiple inputs instead of the purely logic input blocks of the decoder.

20 Claims, 6 Drawing Sheets

METHOD OF TRANSCODING DATA FROM A THERMOMETRIC CODE, DECODER AND CONVERTER APPLYING THIS METHOD

BACKGROUND OF THE INVENTION

The subject of the present invention is a method of transcoding data expressed in digital words of like number of bits, according to a thermometric type coding, the successive values of which can be represented in the form of a first matrix each row of which is a digital word.

Thermometric codes are very frequently employed in particular in analog-digital converters, which, owing to the resistance scales used to define reference levels for comparison, generate thermometric codes internally to the converter. An analog-digital converter therefore has a code converter (or decoder), the function of which is to transform the thermometric code into a binary code. Such a conversion requires a large number of comparators (or gates), thus noticeably increasing the area occupied on an integrated circuit. The conversion of a cyclic thermometric code with $2^N$-bit words into a binary code requires in fact not less than $2^N$ comparators (or gates).

SUMMARY OF THE INVENTION

The subject of the present invention is a method of conversion enabling a thermometric code to be transformed into an intermediate code which can, for its part, be transformed easily in turn into another code, for example, into a binary code, so that the number of comparators (or gates) is noticeably reduced.

The basic concept of the invention consists in taking account of the low information density inherent in thermometric codes in order to obtain an intermediate code with a smaller number of bits.

With this aim, the method according to the invention is characterised in that it uses an intermediate coding defined, on the one hand, by a second matrix which is extracted from the first matrix and one dimension of which is a sub-multiple of a dimension of the first matrix, and on the other hand, by a third matrix the columns of which are particular columns of the first matrix, the row by row juxtaposition of the second and third matrices enabling all the information present in the thermometric starting code to be preserved.

The first matrix is thus transformed into a folded code including two matrices which are easy to decode into binary code since this intermediate code is shorter and again has a thermometric character for each of the second and third matrices, these being at least partly cyclic.

According to a particularly advantageous embodiment, the method is characterised in that the second matrix is constructed following the steps consisting in:

a) selecting from the first matrix so-called triangular sub-matrices whose dimensions are sub-multiples of those of the first matrix forming at least one set of sub-matrices aligned along a diagonal, b) producing the second matrix by a vertically aligned stacking of the said sub-matrices.

Advantage is thus taken of the property of thermometric codes according to which there exist homogeneous blocks either of "0" or "1" which are separated by diagonal lines of the first matrix when it relates to an acyclic thermometric code, or by diagonal lines of each half of the first matrix when it relates to a cyclic thermometric code.

According to a preferred variant, the method is characterised in that the second matrix is rendered at least partly cyclic by interposing between the abovementioned steps, an additional step consisting of carrying out, for half the sub-matrices and alternately, a logical inversion of the elements of these sub-matrices prior to their aligned stacking.

A decoding is thus obtained which can be simplified to the maximum. The third matrix, for its part, consists of columns of the first matrix which have the same numeral as that of the columns of the said triangular sub-matrices for which all the elements are identical.

According to the invention, the method can also include a step of conversion, in particular into binary code, of at least part of the second and third matrices of the intermediate code.

The invention also relates to a decoder, employing the method defined earlier, which includes:

a first set of gates associated with a first decoding module (low significance), the gates of this set being distributed into similar groups of gates called logic blocks having k data inputs with each of which is associated a selection input, the number k being equal to the number of so-called triangular sub-matrices aligned along the same diagonal of the first matrix, a second group of gates with single data input, associated with a second decoding module (high significance), which delivers the high significance bits of the binary output coding, as well as selection signals each of which is applied to one of the k selection inputs in order to enable the corresponding data inputs of each of the logic blocks and which are necessary in order to obtain the low significance bits of the binary code at the output of the first decoding module.

By establishing the notation N and M such that:

N is defined by the fact that $2^N$ is equal to the number of bits of the digital word to be transcoded (thermometric starting code), M is defined by the fact that $2^M$ is equal to the number of the triangular sub-matrices present along the same diagonal of the first matrix, the number of data inputs and selection inputs, for each of the logic blocks, is then equal to $2^M$, and the decoder, characterised in that the $p^{th}$ selection input of each of the logic blocks receives the logic signal resulting from an exclusive-OR between the order $p.2^{N-M}$ and order $(p-1).2^{N-M}$ bits in the digital word to be transcoded, when p takes one of the values from the interval 2 to $2^M$ (endpoints inclusive), and the logic signal resulting from an exclusive-OR with inverting output between the order $2^{N-M}$ and order $2^N$ bits in the digital word to be transcoded, when p is equal to 1.

The number of logic blocks can be chosen equal to $2^{N-M}$, but in a preferred embodiment of the decoder according to the invention, this number of logic blocks is reduced to $2^{N-M}-1$, which can be done when the decoder has logic blocks which are arranged so that their $p^{th}$ data input delivers as output an inverted logic signal when the value of p is even, and it is then characterised, for a thermometric starting code which is cyclic, in that the number of logic blocks is equal to $2^{N-M}-1$, in that the $p^{th}$ data input of the $i^{th}$ logic block receives the data from the order $(p-1).2^{N-M}+i$ bits in the digital word to be transcoded, for i varying from 1 to $2^{N-M}-1$, and in that the order $2^{N-M}$ bit of the second matrix of the intermediate code is obtained at the output of an exclusive-OR gate receiving as input the logic data equal to the order N−M+1 and order N+1 bits of the binary code which are delivered by the second decoding module.

When the thermometric code is acyclic, the order $2^{N-M}$ bit of the second matrix of the intermediate code is obtained directly through the value of the order N−M+1 bit in the binary code delivered by the second decoding module.

The present invention further relates to a converter including a decoder such as defined earlier, and which is characterised in that the logic blocks are produced in the form of analog gates with multiple inputs receiving differential analog signals on amplifiers, one of these signals being a signal to be measured, which is compared with a plurality of references, each pair of differential analog signals constituting an analog equivalent of one of the logic signals previously mentioned as being applied to the data inputs of the said logic blocks, in that each of these analog gates includes means for setting the logic levels of the output signal from the said amplifiers and means for storing these logic levels on a single output of the analog gate to which the outputs of the amplifiers are joined, and in that each analog gate is provided with selection inputs in order to enable one of the amplifiers, the other amplifiers (not selected) of this gate exhibiting a high-impedance state at its output.

Such a converter can be integrated in the form of a semi-conductor circuit of very compact structure.

A converter according to the invention can be arranged so that the inputs of the amplifiers of the analog gates are connected to outputs of interpolation networks, which outputs are possibly linked to folding amplifiers.

This makes it possible to simplify the architecture for decoding the thermometric code delivered by the folding amplifiers, and which is already simpler than the thermometric code which would correspond to the signal to be sampled.

BRIEF DESCRIPTION OF THE DRAWINGS

The invention will be better understood on reading the description which follows, given by way of non-limiting example, in connection with the accompanying drawings which represent.

DESCRIPTION OF THE PREFERRED EMBODIMENTS

Figures 1, 2:
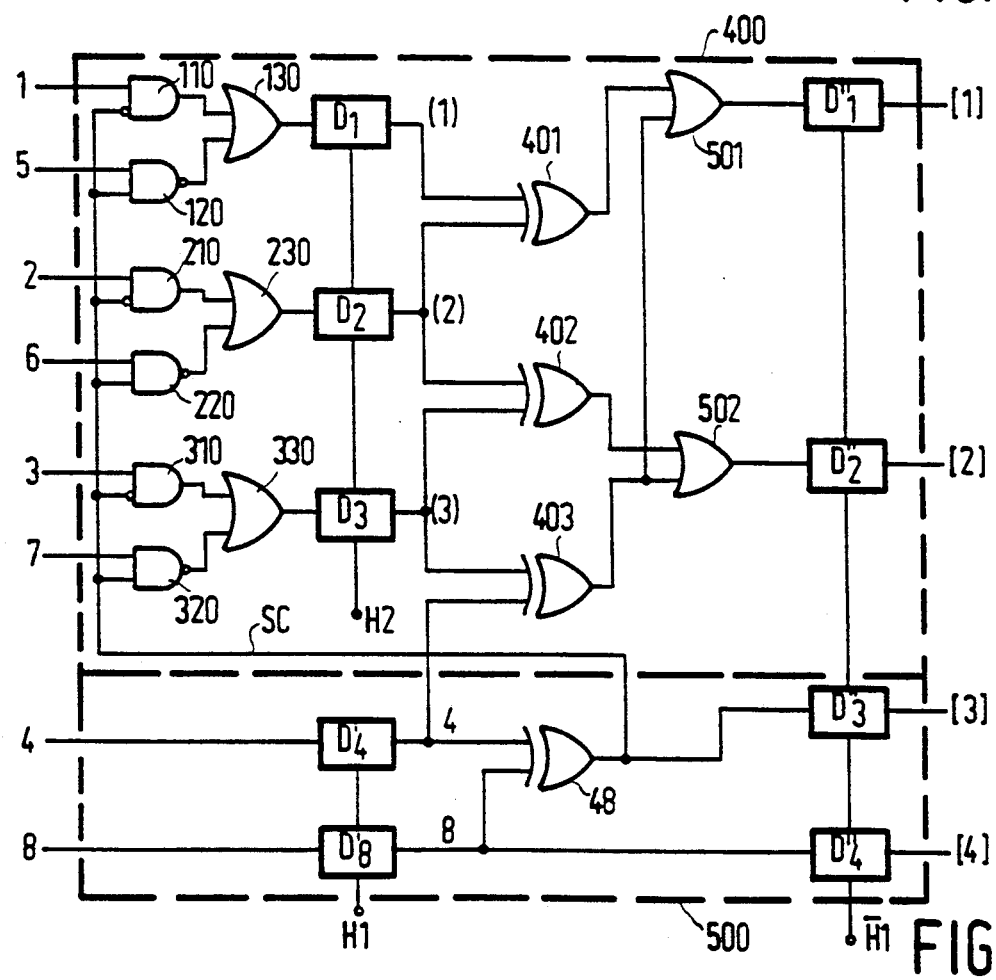
in FIG. 1, a table for the transcoding of data coded according to a cyclic thermometric code of 4 bits (binary equivalent) into a two-matrix code and then into binary code.
in FIG. 2, a circuit for producing such a transcoding.

According to FIG. 1, the successive values of a cyclic thermometric code, expressed in 8-bit words are represented by 8 columns numbered from 1 to 8 from the (right) low significance bit to the (left) high significance bit, and 16 rows. The first row corresponding to the value 0 contains only "0"s. The successive rows from the second to the eighth which correspond to the decimal numbers 1 to 7, have the "0"s of columns 1 to 7 replaced progressively by "1"s. The ninth row contains only "1"s and the successive rows of the tenth to the sixteenth which correspond to the decimal numbers 9 to 15, have the "1"s of columns 1 to 7 replaced progressively by "0"s, the sixteenth row having a single "1" in the eighth column, which ensures cyclic continuity with the first row. Such a code forms part of the family of Gray codes.

In the prior art, for an acyclic code of N bits in a flash converter, the number of comparators required is $2^N-1$. However, for a cyclic code of N+1 bits, the number of required comparators is $2^N$. Nevertheless, according to the invention the number of required comparators is less than $2^N$.

To transcode into binary (4-bit word; N+1=4), according to the prior art, $2^3$, namely 8 comparators are needed.

In FIG. 1 it can be seen that the cyclic code has a fair number of symmetries which have been made evident by decomposing the code into sub-matrices of 4 rows and 4 columns. Only 4 of these sub-matrices carry different information in each row. They have been denoted $M_1$, $M_2$, $M'_1$ and $M'_2$. Sub-matrices $M_1$ and $M_2$ contain a 0 diagonal above which all the bits are "0"s and below which all the bits are "1"s. Sub-matrices $M'_1$ and $M'_2$ contain a 1 diagonal above which all the bits equal "1" and below which all the bits equal "0". Such sub-matrices will be called "triangular" in the remainder of this explanation. The other sub-matrices all contain either "0"s or "1"s, that is to say a single item of information. This item of information can be used to specify, for a given datum, which sub-matrix is concerned. In other words, this latter item of information makes it possible to distinguish sub-matrix $M_1$ from sub-matrix $M_2$, or again sub-matrix $M'_1$ from sub-matrix $M'_2$, that is to say to remove the indeterminacy between the identical sub-matrices. To do this, the simplest solution is to use columns 4 and 8 directly, the bits of which change value only when going from one sub-matrix to another. All the information from the initial thermometric code is therefore preserved by extracting the item of information from sub-matrices $M_1$ to $M_4$ which is aligned vertically to form an intermediate code matrix of 4 columns 16 rows, to which are added columns 4 and 8 forming a control matrix for the intermediate code in order to remove the indeterminacy. In what follows, the intermediate code matrix with 4 columns will be called the second matrix while the set of columns 4 and 8 of the matrix of the initial thermometric code will be called the third matrix.

For practical reasons of immunity to noise, it is advantageous to proceed by inverting the logic data of one sub-matrix out of two, carrying out a bit substitution, namely by replacing the logic data of $M_2$ of $M'_2$ by their logical complement. A second matrix of the intermediate code is thus obtained, of 4 columns denoted (1) (2) (3) and (4) and of 16 rows, by vertically aligning $M_1$, $\overline{M}_2$, $M'_1$ and $\overline{M}'_2$.

The first eight rows and the last eight rows of this second matrix are cyclic, which is beneficial to the subsequent decoding into binary code. Furthermore, the fourth column which was denoted (4) in the second matrix is, in this entirely special case, identical to column 4 of the matrix of the starting thermometric code, termed the first matrix. This column is therefore common to the second matrix and to the third matrix.

It is then easy to transcode the data from the two matrices (1) (2) (3) 4 and 8 into a binary code matrix [1] [2] [3] and [4]. Indeed, the two parts $M_1$, $\overline{M}_2$, and $M'_1$, $\overline{M}'_2$, each form a cyclic code, as do columns 4 and 8 of the third matrix, and decoding is therefore simplified since it is carried out over a smaller number of bits.

FIG. 2 represents a decoder organised according to the data conversion table of FIG. 1.

The bits from column (1) (second matrix) of the intermediate code matrix arise from the data of the first matrix of the cyclic thermometric code either from column 1 or from the inverse of the data from column 5 according to whether the data from columns 4 and 8 of this matrix are or are not identical. The same goes for the bits from columns (2) (3) of the second matrix. AND gates 110, 120, 210, 220, 310, 320 are used to this end. One input of these AND gates receives the logic data corresponding to columns 1, 5, 2, 6, 3 and 7 respectively. The logic data corresponding to columns 4 and 8 are applied directly to D-type flip-flops $D'_4$ and $D'_8$ respectively, which are activated in time with a clock $H_1$. The output from these flip-flops $D'_4$ and $D'_8$ is applied to the inputs of an exclusive-OR gate 48 whose output delivers a selection signal SC indicative of the fact that the logic data from columns 4 and 8 are or are not identical. A second input of the AND gates 110, . . ., 320 serves as a selection input and receives to this end the selection signal SC output from the gate 48, doing so either directly (gates 120, 220, 320), or after inversion, (gates 110, 210, 310). An OR gate 130 has its inputs connected to the output of gates 110 and 120, and an OR gate 230 has its inputs connected to the output of gates 210 and 220 and an OR gate 330 has its inputs connected to the output of gates 310 and 320. To carry out the logical inversion of the contents of sub-matrices $M_2$ and $M'_2$, the AND gates 120, 220 and 320 are output-inverting gates. When columns 4 and 8 of the first matrix have identical data, the output from gate 48 is at the "0" level and enables the AND gates 110, 210, and 310. The data corresponding to columns 1, 2 and 3 of the first matrix are taken into account when they relate to sub-matrices $M_1$ and $M'_1$.

When the data from columns 4 and 8 differ, the output from gate 48 is at the "1" logic level and enables gates 120, 220 and 320. The data corresponding to columns 5, 6 and 7 of the first matrix are taken into account when they relate to sub-matrices $M_2$ and $M'_2$.

The OR gates 130, 230 and 330 therefore deliver signals indicative of columns (1) (2) (3) of the second matrix of the intermediate code. The output from these same gates is applied to the input of D-type flip-flops namely $D_1$, $D_2$ and $D_3$, timed with a clock signal $H_2$. The enabling edge of the clock signal $H_2$ is provided so as to follow, after a short timespan, the enabling edge of the clock signal $H_1$ timing the flip-flops $D'_4$ and $D'_8$ so as to enable the data output of the OR gates 130, 230 and 330 when they have been stabilised. However, the clock signals $H_1$ and $H_2$ pass synchronously to the state of non-enabling of the flip-flops D.

It should be noted henceforth that a set of gates such as the AND gates 110, 120, the OR gate 130 and the flip-flop $D_1$ can in fact be produced very compactly as will be seen in the remainder of this explanation, in a mode of construction in which the logic inputs such as input 1 and input 5 are replaced by their analog equivalent. Such a set will be called an analog gate with multiple inputs.

The transformation into binary code on the basis of the outputs from flip-flops $D_1$, $D_2$, $D_3$, $D'_4$ and $D'_8$ is particularly easy by virtue of the properties of the intermediate code defined above. The high significance bit [4] of the binary code is obtained simply by taking directly the data bit corresponding to column 8 of the first matrix representing the starting cyclic thermometric code. The bit of immediately lower order [3] of the binary code is obtained by an exclusive-OR between the bits from columns 4 and 8 at the output of the exclusive-OR gate 48. The bit of second order [2] of the binary code is at "1" either when the values of columns (2) and (3) of the second matrix are inverses or again, when the values of columns (3) and (4) of the same matrix are inverses. Thus, an exclusive-OR gate 402 receives as input the result outputs from columns (2) and (3), and an exclusive-OR gate 403 receives as input the result outputs from columns (3) and (4) of the second matrix. The outputs from these gates 402 and 403 are applied to the inputs of an OR gate 502 delivering the bit of order [2].

The bit of order [1] of the binary code is at "1" when the values of columns (1) and (2) on the one hand or of columns (3) and (4) on the other hand, of the second matrix, are inverses. The bit of order [1] is therefore obtained at the output of an OR gate 501, which receives on its inputs the outputs from the gates 401 and 403.

In FIG. 2 the D-type flip-flops $D''_1$, $D''_2$ $D''_3$ and $D''_4$ are of use in obtaining correct synchronisation of the results coded into binary. These latter flip-flops are timed with a clock signal $\overline{H}_1$ which is a logical inverse of the clock signal $H_1$. The outputs of the binary result are therefore stabilised during the inactive part of the clock signals $H_1$ and $H_2$ which is common and synchronous as stated earlier.

Figure 3:
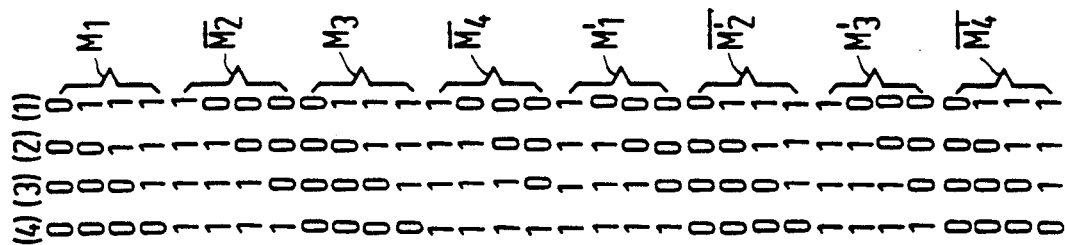
in FIG. 3, a table for the transcoding of data appearing through a cyclic thermometric code of 5 bits (binary equivalent)
Figure 3:
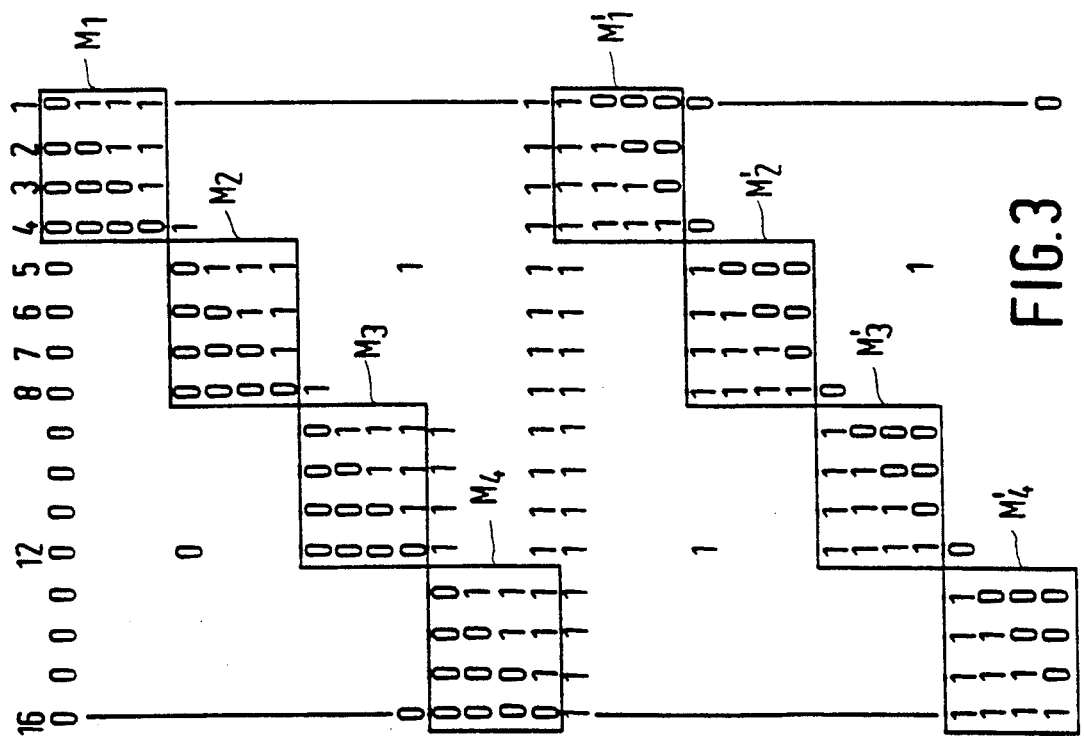

FIG. 3 represents the transformation of data expressed in words of 16-bits in length corresponding to a cyclic thermometric code with $N+1=5$ bits (in a binary valuation), which has $2^N$ columns, i.e. 16 columns and $2^N+1$ rows, i.e. 32 rows. It has been chosen to compress the code with the aid of so-called triangular sub-matrices of 4 rows and 4 columns, i.e. a compression in a ratio 16/4=4. The first four sub-matrices $M_1$, $M_2$, $M_3$, and $M_4$ have a "zero" diagonal, and the last four sub-matrices $M'_1$, $M'_2$, $M'_3$ and $M'_4$ a "one" diagonal. The first four sub-matrices thus form a first set of triangular sub-matrices aligned along one of their diagonals, and the last four sub-matrices, a second set of triangular sub-matrices aligned along one of their diagonals.

After transcoding into intermediate code, the latter has eight columns, the 4 columns corresponding to the low significance bits are constituted by the vertical alignment of sub-matrices:

$M_1, \overline{M}_2, M_3, \overline{M}_4, M'_1, \overline{M}'_2, M'_3, \overline{M}'_4$ which form columns (1) (2) (3) and (4) of the second matrix forming the intermediate code. The four remaining columns, 4, 8, 12 and 16 represent the high significance bits and are used to remove the indeterminacy in the position of the relevant sub-matrix in the starting cyclic code. These columns correspond to the leftmost columns (towards the high significance bits) of the abovementioned triangular sub-matrices since they possess the property that their binary value changes over the diagonals along which the matrices are aligned and hence they yield an item of position information.

Figure 4:
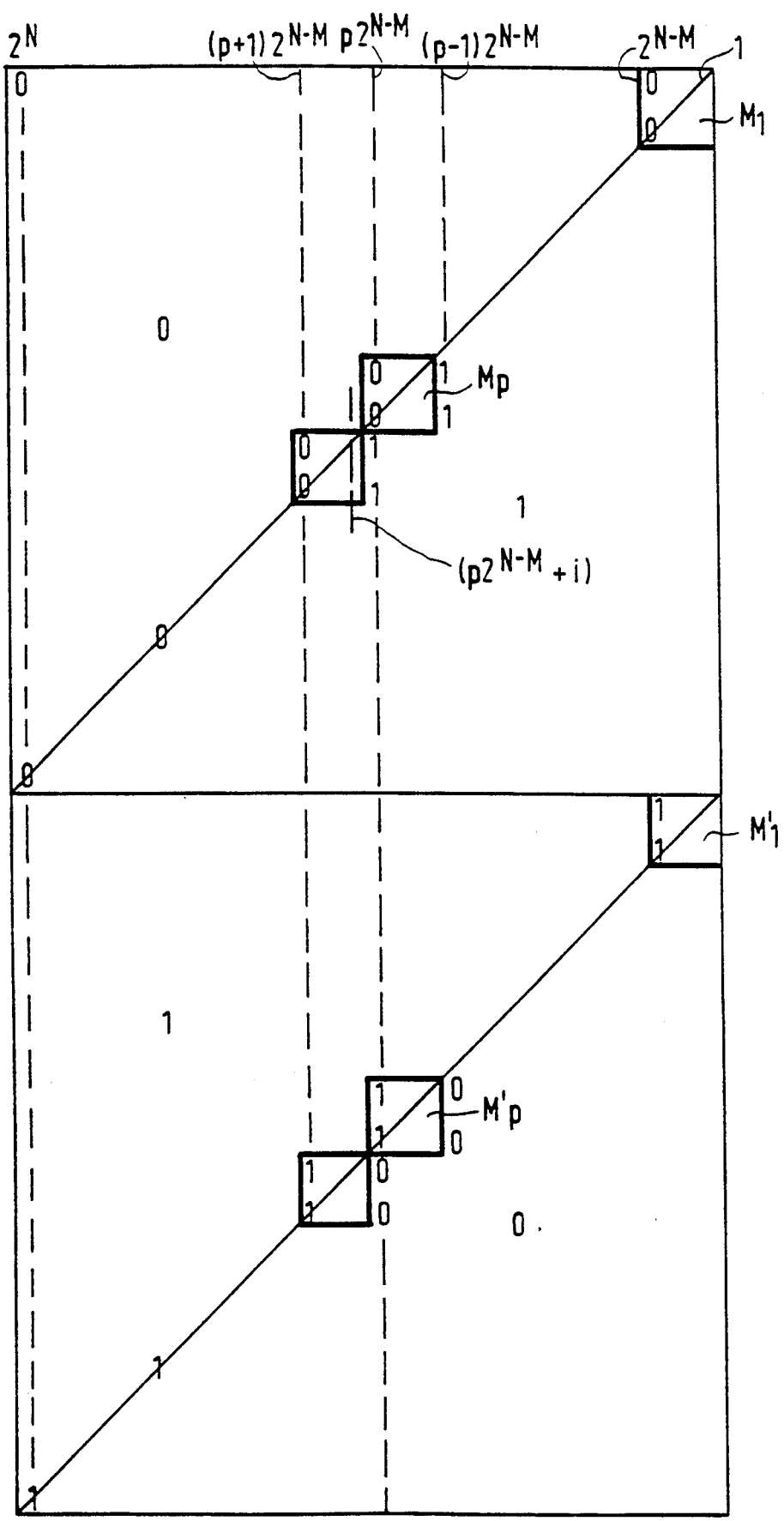
in FIG. 4, a representation of the successive data according to a cyclic thermometric code of N+1 bits (binary equivalent) with $2^N$ columns, in order to illustrate the processing of triangular sub-matrices according to the invention, in FIG. 5, a converter for the transcoding of data expressed in words of N+1 bits according to a cyclic thermometric coding employing an intermediate code according to the invention.

FIG. 4 shows the generalisation to a cyclic code with (N+1) bits (evaluated in binary), i.e. a cyclic starting code with $2^N$ columns. Each diagonal of the initial code is decomposed into $2^M$ triangular sub-matrices, each triangular sub-matrix having $2^{N-M}$ rows and $2^{N-M}$ columns. Each sub-matrix of order p has its right-hand column aligned with the $[(p-1)2^{N-M}+1]^{th}$ column of the cyclic starting code and its left-hand column aligned with the $[p2^{N-M}]^{th}$ column of the cyclic starting code with p varying from 1 to $2^M$.

The position of a sub-matrix of order p, ($M_p$ or $M'_p$) can be defined from the values contained in the columns $p2^{N-M}$ of the cyclic starting code, as a function of the property of the diagonals already mentioned above. After transcoding, the intermediate code is then constituted by the aligned stacking of sub-matrices:

$$M_1, \overline{M}_2, \ldots, M_p, \ldots, \overline{M}_2{}^M, M'_1, \overline{M}'_2, \ldots, M'_p, \ldots, \overline{M}'_2{}^M$$

forming the said second matrix, to which are added columns $p\,2^{N-M}$ of the starting code for p varying from 1 to $2^M$, which form the said third matrix.

Figure 5:
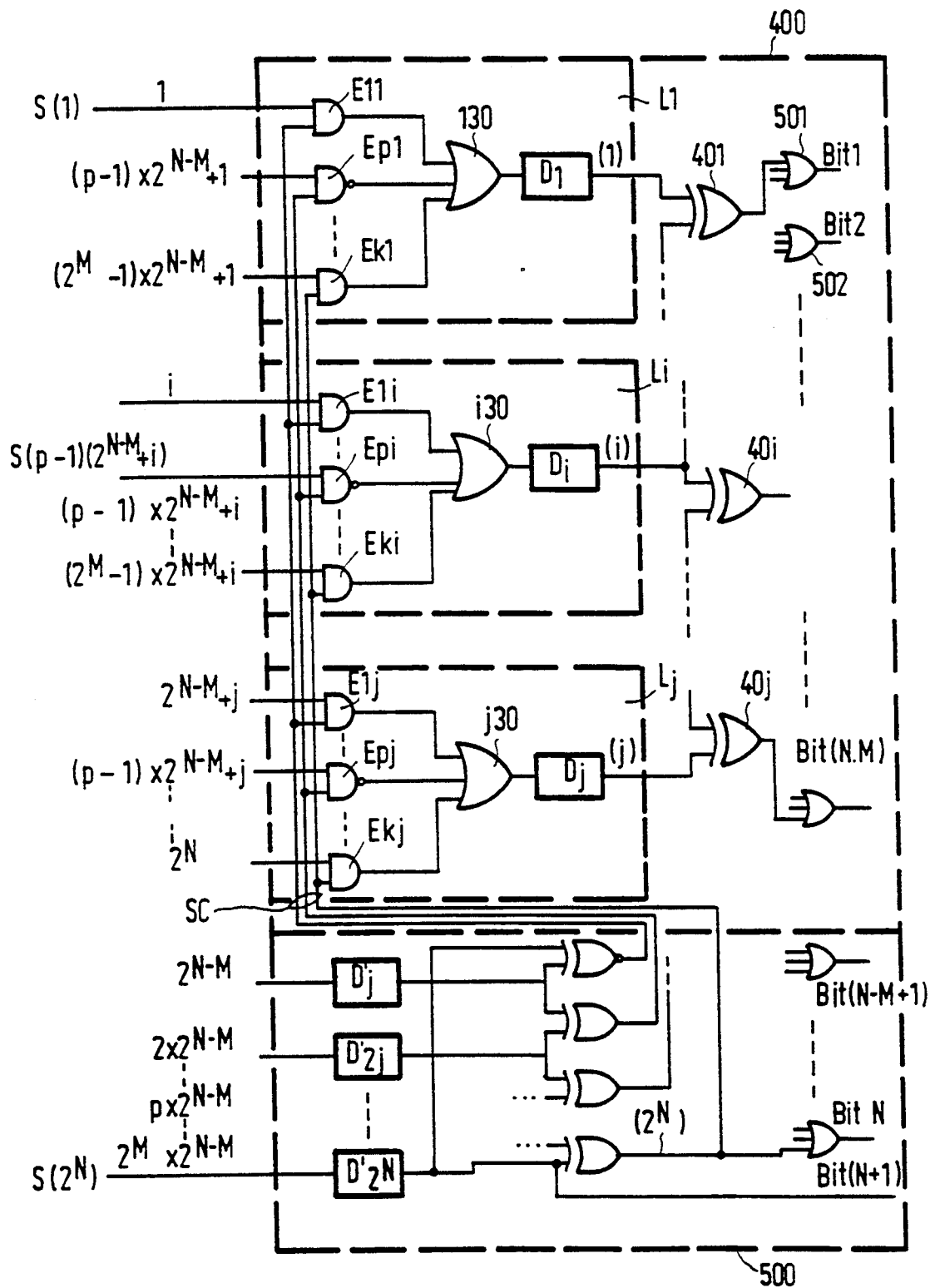

The decoder of FIG. 5 employs the compression of a thermometric starting code into an intermediate code such as defined earlier, an intermediate code whose successive values appear in the form of a second matrix and a third matrix allowing selection of data from the second matrix. By generalising the foregoing, it is noted that a data item from column (i) of the second matrix of the intermediate code is obtained from ad hoc splitting of the columns:

$$i, 2^{N-M}+i, \ldots, [(p-1)2^{N-M}+i], \ldots,$$
$$[(2^M-1)2^{N-M}+i]$$

of the first matrix, i varying from 1 to $2^{N-M}$, and as a function of the information contained in columns $2^{N-M}, 2.2^{N-M}, \ldots, p.2^{N-M}, \ldots, 2^N$, for p varying from 1 to $2^M$.

The decoder of FIG. 5 therefore employs $2^{N-M}=j$ logic blocks or equivalent analog gates denoted $L_l, \ldots, L_i, \ldots, L_j$, each containing $2^M$ input cells denoted $E_{li}, \ldots, E_{pi}, \ldots, E_{ki}$, ($K=2^M$), whose outputs are connected to an input of OR gates with $2^M$ inputs denoted l30, ..., i30, ..., j30. As will be seen in what follows, the said input cells $E_{pi}$ can, in a variant not shown in FIG. 5, take the form of analog gates with $2^M$ analog signal inputs and $2^M$ selection inputs, in which case the OR gates l30, i30 and j30 can be omitted when such analog gates have outputs at high impedance corresponding to the non-selected inputs. It will also be seen in what follows that the flip-flop D for storing the output data from each of the blocks $L_l, \ldots, L_i, \ldots, L_j$, can form an integral part of such analog gates.

The logic block $L_i$ receives on its data inputs the data from the $(p-1).2^{N-M}+i^{th}$ column of the cyclic starting code. It furthermore receives on another so-called selection input, a signal which forms part of a group of control signals SC and which is the result of an exclusive-OR between the successive columns $p.2^{N-M}$ for p varying from 1 to $2^M$. The series of signals SC is supplemented with the output from an inverted exclusive-OR receiving as input the data from the columns denoted $2^{N-M}$ and $2^N$ of the third matrix.

To produce the logical inverse of the so-called triangular matrices (sub-matrices of even order) the input cells $E_{pi}$ are output-inverting when p is even.

In the version constructed with the aid of analog gates with multiple inputs which has already been referred to and which will be described subsequently, the number of these analog gates rises to $2^{N-M}$ only and not now to $2^N$ as in the prior art to which are added $2^M$ gates for input of the high significance data to obtain the intermediate code of the invention from a cyclic thermometric code. The $2^M$ exclusive-OR gates used for the decoding of the high significance bits of the binary code also serve in the selection of the inputs of the logic blocks (or of the equivalent analog gates) decoding the low significance bits. Transferring from the intermediate code of the invention to the binary code requires no additional comparator but merely OR gates and/or exclusive-OR gates.

Fewer comparators are therefore needed than in the case of a conventional decoder for the decoding of data expressed in thermometric code, namely $2^N$ comparators.

According to an advantageous variant already used in the diagram of FIG. 2, a saving of one logic block or its equivalent in analog gates with multiple inputs can be made. This involves the block denoted $L_j$ corresponding to the processing of column $2^{N-M}$ of the second matrix of the intermediate code. Indeed, the corresponding data are redundant with the information contained in the third matrix of the intermediate code. As will be seen later, this property can be generalised in all cases so that, finally, $2^{N-M}+2^M-1$ necessary comparators are needed, that is to say one fewer than what was indicated earlier. This number of comparators is quite clearly much less than $2^N$, which number was required according to the prior art.

EXAMPLES

I) N+1=4 (code with 4 binary equivalent bits)
1) $2^N=8$, i.e. 8 comparators for decoding according to the prior art.
2) M=1
   $0.2^{N-M}+2^M-1=4+2-1=5$ comparators for decoding according to the invention. A noteworthy result is obtained even for this low number of bits.

II) N+1=10 (code with 10 binary equivalent bits)
1) $2^N=512$, i.e. 512 comparators for decoding according to the prior art.
2) M=2
   $2^{N-M}+2^M-1=128+4-1=131$ comparators for decoding according to the invention.
3) M=3
   $2^{N-M}+2^M-1=64+8-1=71$ comparators for decoding according to the invention.
4) M=4
   $2^{N-M}+2^M-1=32+16-1=47$ comparators for decoding according to the invention.
5) M=5
   $2^{N-M}+2^M-1=16+32-1=47$ comparators.

In the case of a folding and interpolating converter, the size of the decoder of the high significance bits is preferably less than that of the decoder of the low significance bits.

From this it results that $2^M \leq 2^{N-M} - 1$.

The optimum is obtained by choosing M as large as possible but less than or equal to N/2. If N is even, M=N/2 is chosen. If N is odd, M=N/2−0.5 is chosen.

In the above example, the case No. 5 (N=9, M=5) is of no interest. The optimum is No. 4 (M=4) with 47 comparators instead of the 512 of the prior art.

FIG. 5 will help to establish how the data of the two-matrix intermediate code can be transcoded into data expressed according to the conventional binary code. The decoder of FIG. 5 relates to an example in which the starting data are expressed in digital words of $2^N$ bits within a cyclic thermometric type coding (code with (N+1) binary equivalent bits). Ti this end thought is given as to which are the exclusive-OR gates such as the gates $40l, \ldots, 40i, \ldots, 40j$ which give rise to the appearance of an enabling bit at "1" (bit q=1) in the binary coding, and then to perform the logical summation of these cells. Complementarily, an analog operation is carried out on the outputs from the exclusive-OR gates which, after processing of the third matrix, generate the selection signals SC.

The decoder of FIG. 5 therefore includes a first decoding module for the low significance bits (400) and a second decoding module for the high significance bits (500). The second decoding module 500, with which are associated the logic inputs $D'_j, \ldots, D'_{2^N}$, delivers logic signals SC in the guise of selection signals for the logic blocks $L_l$ to $L_j$ at the input of the decoding module 400. Each part of the decoding modules 400 and 500, whose objective is to transform into a binary code data presented in the form of the intermediate code, of thermometric type, is conventional and known per se although the signals processed by the decoding module 500 are signals specific to the invention. The construction of these parts of the decoder uses exclusive-OR gates and OR gates.

It may be noted that there are two ways of obtaining the data from the column of order $2^{N-M}$ of the second matrix of the intermediate code. There is indeed some redundancy between the information contained in the column of order $2^{N-M}$ of the second matrix and the information arising from the columns of the third matrix.

Figure 6:
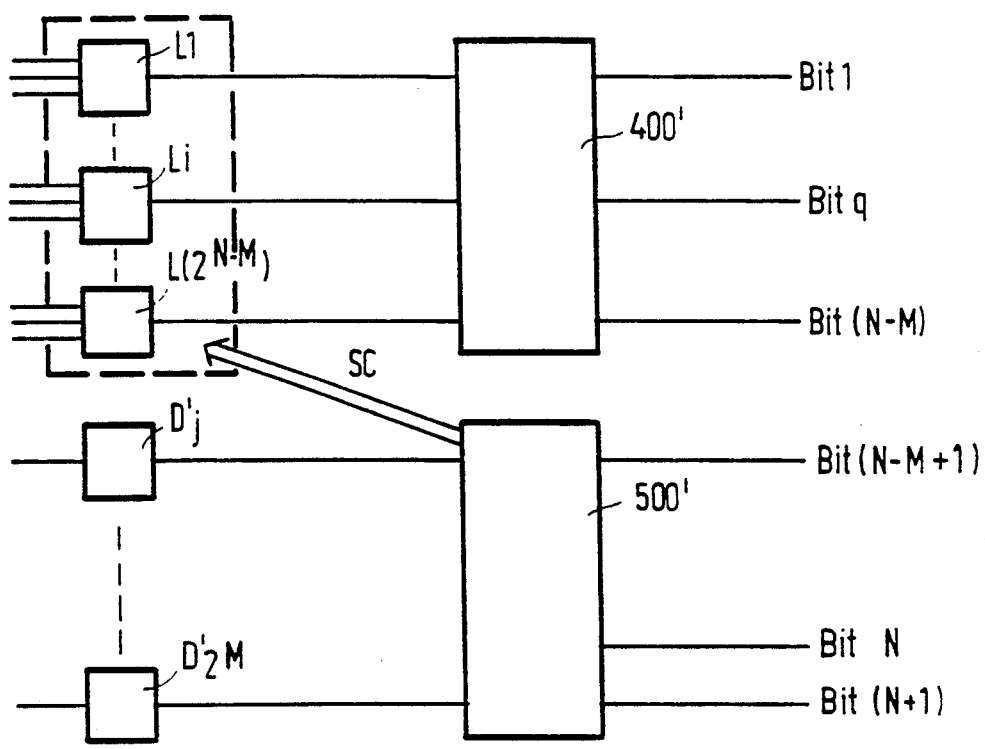
in FIG. 6, a block diagram representing diagrammatically the organisation of a decoder according to a first mode of implementation of the invention.

According to FIG. 6 which diagrammatically takes up again the decoder of FIG. 5, the number of logic blocks $L_l, \ldots, L_j$ extends as far as the value $j=2^{N-M}$. The low significance decoding sub-module 400' delivers the binary decoding of all the low significance bits up to binary bit N−M. For its part, the decoding sub-module 500' delivers the selection signals SC for suitable enabling of the inputs of the logic blocks $L_l$ to $L_j$.

More precisely, the $p^{th}$ selection input of each of the logic blocks receives the logic signal resulting from an exclusive-OR between the order $p.2^{N-M}$ and order $(p-1).2^{N-M}$ bits in the digital word to be transcoded, when p takes one of the values from the interval 2 to $2^M$ (endpoints inclusive), and the logic signal resulting from an exclusive-OR with inverting output between the order $2^{N-M}$ and order $2^N$ bits in the digital word to be transcoded, when p is equal to 1. In this case, the $p^{th}$ data input of the $i^{th}$ logic block receives the data from the order $(p-1).2^{N-M}+i$ bits in the digital word to be transcoded, for i varying from 1 to $2^{N-M}$.

Figure 7:
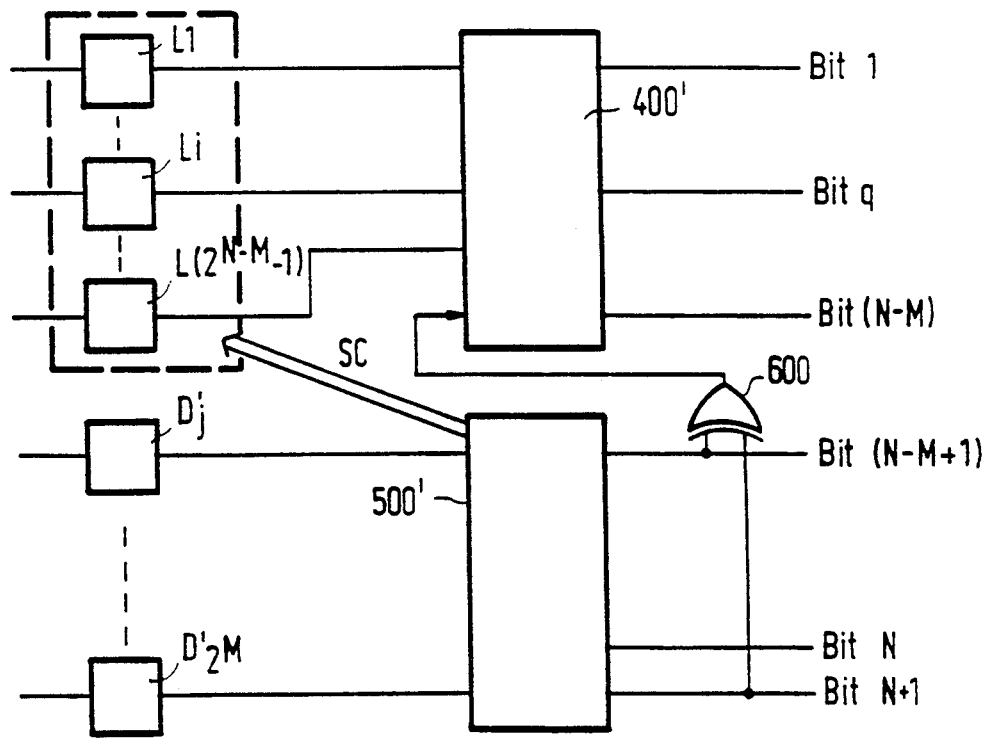
in FIG. 7, a block diagram similar to that of FIG. 6, but relating to a second mode of implementation of the invention, in FIG. 8, an electrical diagram for an illustrative embodiment of a segment of the circuit of FIG. 2, in bipolar transistor technology.

According to a preferred variant represented in FIG. 7, one of the logic blocks is deleted and the number of these blocks now extends only from $L_1$ up to $L(2^{N-M}-1)$. A saving is made as regards the logic block of index $2^{N-M}$ and the bit from column $2^{N-M}$ of the second matrix of the intermediate code is thus missing. It will nevertheless be delivered to the decoding sub-module 400' with the aid of an exclusive-OR gate 600 receiving as input the bits (N−M+1) and (N+1) of the binary code which are produced by the high significance decoding sub-module 500'. Thus, part of the decoding of the high significance bits is taken advantage of in order to decode certain of the low significance bits. However, this applies when the decoder is arranged with logic blocks such that their $p^{th}$ data input delivers as output an inverted logic signal when the value of p is even. So, when the thermometric starting code is cyclic, the $p^{th}$ data input of the $i^{th}$ logic block receives the data from the order $(p-1).2^{N-M}+i$ bits in the digital word to be transcoded, for i varying from 1 to $2^{N-M}-1$, and the order $2^{N-M}$ bit of the second matrix of the intermediate code is obtained at the output of an exclusive-OR gate receiving as input the logic data equal to the order N−M+1 and order N+1 bits of the binary code which are delivered by the second decoding sub-module 500'.

When the data appear through an acyclic thermometric coding and in a decoder again having logic blocks which are arranged such that their $p^{th}$ data input delivers as output an inverted logic signal when the value of p is even, the number of logic blocks being reduced to $2^{N-M}-1$, the $p^{th}$ data input of the $i^{th}$ logic block receives the data from the order $(p-1).2^{N-M}+i$ bits in the digital word to be transcoded, for i varying from 1 to $2^{N-M}-1$, and the order $2^{N-M}$ bit of the second matrix of the intermediate code is obtained directly through the value of the N−M+1 bit in the binary code delivered by the second decoding sub-module 500'.

Figure 8:
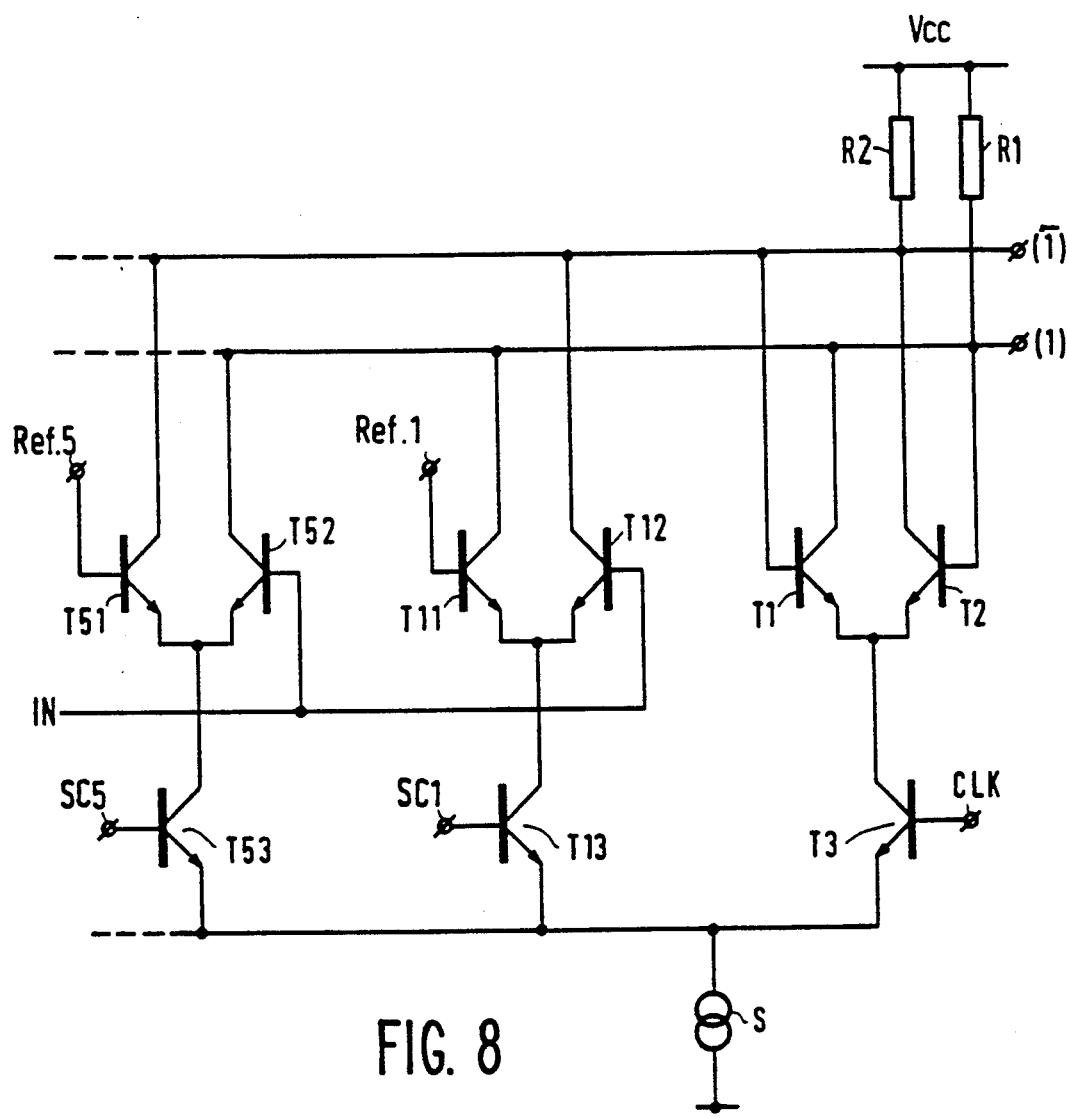

FIG. 8 provides an electrical diagram of an illustrative embodiment of a circuit segment of FIG. 2 in bipolar transistor technology. In FIG. 2, the AND gates 110, 120, the OR gate 130 and the flip-flop D1 form a group of gates called a logic block hereafter when describing FIGS. 5, 6 and 7. An equivalent for analog input signals is produced here in a particularly economical way using the routing of a single current provided by a current source S.

This source S supplies, from the reference terminal (ground) the emitter-collector path of three transistors T3, T13 and T53, only one of these transistors conducting at a given instant, under the command of appropriate control signals: CLK, SC1 and SC5. The signal CLK is a clock signal having priority over the signals SC1 and SC5, the latter two being provided so as to be active singly as was shown earlier with regard to the control signals SC.

The analog signals at the inputs denoted Ref1 and Ref5 correspond to reference signals to be compared with a signal IN to be measured. These comparisons are made by two differential amplifiers consisting of the pairs of transistors T11, T12 and T51, T52, the collector currents of which provide output signals (1) and (Ī) on load resistors R1 and R2 which are furthermore connected to the positive supply voltage Vcc. In accordance with the diagram of gates 110 and 120 of FIG. 2, the differential output signal from the amplifier T11, T12 is logically inverted with respect to that from amplifier T51, T52.

The transistor T3 is controlled by the signal CLK and supplies a pair of transistors T1, T2 whose collectors are connected to the load resistors R1 and R2, respectively and whose bases are cross-coupled with the collectors. At the instant when the transistor T3 becomes conducting, the differential signal on the outputs (1) and ($\overline{1}$) is confirmed as (complementary) logic levels and held in this state during the enabling of the signal CLK. It should be noted that in this set-up, the functions equivalent to the gates 110, 120 as well as the storage function (flip-flop D1), such as were shown in FIG. 2, are carried out here simply and compactly. The OR gate 130 of FIG. 2 is reduced here to a connection node.

In the case in which the number of analog inputs to be combined would be higher than the two of the example described, it suffices simply to add three additional transistors to an additional input, namely: a current routing transistor Tx3, (the counterpart of transistors T13, T53), controlled by a selection signal SCx, as well as a differential pair Tx1, Tx2 (the counterpart of the pairs T11, T12; T51, T52) receiving its analog signal IN on an input to be compared with a reference signal Refx. Such a possibility has been symbolised in FIG. 8 by extending with dashes the lines common to these elements.

A very important result from a practical point of view is obtained with the set-up just described since the consumption of current by the analog gate is fixed by the current source S and remains independent of the number of inputs. The analog gate with multiple inputs of FIG. 8 can be simply and compactly integrated. It can be supplied with input equally well by signals having logic levels as by analog signals. It includes means for setting logic levels for the output signal as well as means for storing these logic levels which are comparable to the effect of a D-type flip-flop. Only one amplifier, consisting of a differential pair of transistors, is enabled at a time, the other amplifiers of the same analog gate having their output in a high-impedance state.

Figure 9:
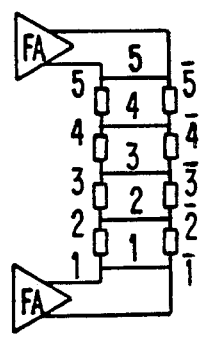
FIG. 9 shows an interpolation network.

It should be noted that the inputs of such an analog gate can be connected to outputs of interpolation networks, such as that shown in FIG. 9, which resistor networks are possibly linked to the output of folding amplifiers FA within an analog-digital converter. For further details about this type of known converters, refer to the article "An 8-bit Video ADC Incorporating Folding and Interpolation Techniques" by Rob Van de Grift et al. (IEEE Journal of Solid State Circuits, vol. SC-22, no. Dec. 6, 1987, p. 944-953), the contents of which are incorporated by reference, in the present description.

Of course, the diagram of FIG. 8 represents only an example according to bipolar transistor technology, whereas the invention is considerably more general and can be applied for the production of decoders and converters constructed with other technologies, using field-effect transistors, for example.

Moreover, the intermediate code defined in the invention has at least some segments with thermometric character, and therefore can itself be subjected to a novel compression according to the method described, culminating in a second intermediate code providing digital words with an even further reduced number of bits. Such an iteration of the method of the invention can be carried out several times. In applications where the words of the thermometric starting code have a very high number of bits, an iteration of the method can be advantageous even though it increases the number of layers of logic gates working in series.

The logic equations corresponding to the transcoding method according to the invention, culminating in a binary code as output, will now be given. To introduce the notation, we firstly give the logic equation allowing the transcoding of an acyclic thermometric code into binary code without going via the intermediate code provided for in the invention. The value of the order q bit of the binary code can be obtained through:

$$\text{Bit } q = \sum_{p=1}^{2^{N-q}} \left[ \sum_{i=1}^{2^{q-1}} D_{(p.2q-i)} \oplus D_{(p.2q-i+1)} \right]$$

D(x) represents the value of the order x bit in the thermometric code, $\Sigma$ designates logical summation (OR logic function), $\oplus$ designates an exclusive-OR.

The transcoding into binary code using the intermediate code in accordance with the invention can be described by considering the following cases:

a) for $1 \leq q = N - M$ (the $N-M$ low significance bits of the binary code):

$$\text{Bit } q = \sum_{p=1}^{2^{N-M-q}} \left[ \sum_{i=1}^{2^{q-1}} D_{(p.2q-i)} \oplus D_{(p.2q-i+1)} \right]$$

D(x) now designating the logic value output by the $x^{th}$ logic block $L_1, \ldots, L_i, \ldots, L_j$ (FIG. 5), that is to say the $x^{th}$ column of the $2^{nd}$ matrix of the intermediate code. The equation has the same form as previously since each triangular sub-matrix of the starting code is itself of thermometric type.

b) for $1 + N - M \leq q \leq N$ (the M high significance bits of the binary code):

$$\text{Bit } q = \sum_{p=1}^{2^{N-q}} \left[ \sum_{i=1}^{2^{q-N+M-1}} D'_{(p.2q-N+M-i).2^{N-M}} \oplus D'_{(p.2q-N+M-i+1).2^{N-M}} \right]$$

D'(x) designating the logic value output by the $x^{th}$ flip-flop D'j, ..., D'k, ..., D'$_{2^N}$ which corresponds to the values of the successive columns of the $3^{rd}$ matrix of the intermediate code (high significance).

When the starting data are in the form of a cyclic thermometric code with $2^N + 1$ bits, c) Bit $N + 1 = D'_{2^N}$, that is to say the bit from the column denoted $2^N$ of the $3^{rd}$ matrix.

Here again it is found that the bits of the binary code are obtained as output from OR gates with multiple inputs (501, 502, ...) receiving exclusive-OR outputs (40l, ..., 40j), (FIG. 5), hence without the addition of comparators.

We claim:

1. A method of transcoding data expressed in digital words of like number of bits according to a thermometric type coding, successive values of which can be represented in the form of a first matrix, each row of which is a digital word, the method comprising: deriving an intermediate coding defined, on the one hand, by a second matrix which is extracted from the first matrix and one dimension of which is a sub-multiple of a dimension of the first matrix, and on the other hand, by a third matrix the columns of which are particular columns of the first matrix, juxtapositioning, row by row, the second and third matrices so as to preserve all of the information present in the thermometric starting code.

2. A method according to claim 1, wherein the second matrix is constructed comprising steps of:
 a) selecting from the first matrix, so-called triangular sub-matrices whose dimensions are sub-multiples of those of the first matrix forming at least one set of sub-matrices aligned along a diagonal,
 b) producing the second matrix by a vertically aligned stacking of said sub-matrices.

3. A method according to claim 2, wherein the second matrix is rendered at least partly cyclic by interposing between the abovementioned steps, an additional step which comprises carrying out, for half of the sub-matrices and alternately, a logical inversion of the elements of said sub-matrices prior to their aligned stacking.

4. A method according to claim 3, in which N is defined by the fact that $2^N$ is equal to the number of bits of the digital word to be transcoded (thermometric starting code), M is defined by the fact that $2^M$ is equal to the number of said sub-matrices present along the same diagonal of the first matrix, characterized in that, for the transcoding of a digital word into binary code, a bit of order q of the binary code (Bit q) results from the following logical operations:
 a) for $1 \leq q \leq N-M$ (the (N−M) low significance bits of the binary code)

$$\text{Bit } q = \sum_{p=1}^{2^{N-M-q}} \left[ \sum_{i=1}^{2^q-1} D_{(p.2q-i)} \oplus D_{(p.2q-i+1)} \right]$$

$D_{(x)}$ designating the datum contained in the order x column of the first matrix, b) for $1+N-M \leq q \leq N$ (the M high significance bits of the binary code)

$$\text{Bit } q = \sum_{p=1}^{2^{N-q}} \left[ \sum_{i=1}^{2^{q-N+M}-1} D'_{(p.2q-N+M-i).2N-M} \oplus D'_{(p.2q-N+M-i+1).2N-M} \right]$$

$D'_x$ designating the data contained in the order x column of the third matrix, c) and for the case in which the thermometric starting code with $2^N$ bits is cyclic, the N+1st bit of the binary code is obtained directly through:

Bit $N+1 = D'_{(2^N)}$ that is to say the bit of highest significance in the digital word to be transcoded.

5. A method according to claim 2 wherein the columns of the third matrix are those of the first matrix which have the same numeral as that of the columns of the said triangular sub-matrices for which all the elements are identical.

6. A method according to claim 2, in which N is defined by the fact that $2^N$ is equal to the number of bits of the digital word to be transcoded (thermometric starting code), M is defined by the fact that $2^M$ is equal to the number of the said sub-matrices present along the same diagonal of the first matrix, characterized in that, for the transcoding of a digital word into binary code, a bit of order q of the binary code (Bit q) results from the following logical operations:
 a) for $1 \leq q \leq N-M$ (the (N−M) low significance bits of the binary code)

$$\text{Bit } q = \sum_{p=1}^{2^{N-M-q}} \left[ \sum_{i=1}^{2^q-1} D_{(p.2q-i)} \oplus D_{(p.2q-i+1)} \right]$$

$D_{(x)}$ designating the datum contained in the order x column of the first matrix, b) for $1+N-M \leq q \leq N$ (then M high significance bits of the binary code)

$$\text{Bit } q = \sum_{p=1}^{2^{N-q}} \left[ \sum_{i=1}^{2^{q-N+M}-1} D'_{(p.2q-N+M-i).2N-M} \oplus D'_{(p.2q-N+M-i+1).2N-M} \right]$$

$D'_x$ designating the data contained in the order x column of the third matrix, c) and for the case in which the thermometric starting code with $2^N$ bits is cyclic, the N+1st bit of the binary code is obtained directly through:

Bit $N+1 = D'_{(2^N)}$ that is to say the bit of highest significance in the digital word to be transcoded.

7. A method according to claim 1, in which N is defined by the fact that $2^N$ is equal to the number of bits of digital word to be transcoded (thermometric starting code), M is defined by the fact that $2^M$ is equal to the number of the said sub-matrices present along the same diagonal of the first matrix, characterised in that, for the transcoding of a digital word into binary code, a bit of order q of the binary code (Bit q) results from the following logical operations:
 a) for $1 \leq q \leq N-M$ (the (N−M) low significance bits of the binary code)

$$\text{Bit } q = \sum_{p=1}^{2^{N-M-q}} \left[ \sum_{i=1}^{2^q-1} D_{(p.2q-i)} \oplus D_{(p.2q-i+1)} \right]$$

$D_{(x)}$ designated the datum contained in the order x column of the first matrix, b) for $1+N-M \leq q \leq N$ (the M high significance bits of the binary code)

$$\text{Bit } q = \sum_{p=1}^{2^{N-q}} \left[ \sum_{i=1}^{2^{q-N+M}-1} D'_{(p.2q-N+M-i).2^{N-M}} \oplus D'_{(p.2q-N+M-i+1).2^{N-M}} \right]$$

$D'_x$ designating the data contained in the order x column of the third matrix, c) and for the case in which the thermometric starting code with $2^N$ bits is cyclic, the $N+1^{st}$ bit of the binary code is obtained directly through:

Bit $N+1 = D'_{(2^N)}$ that is to say the bit of highest significance in the digital word to be transcoded.

8. A method according to claim 1 wherein the columns of the third matrix are those of the first matrix which have the same numeral as that of the columns of the said triangular sub-matrices for which all the elements are identical.

9. A decoder for transcoding data expressed in digital words of identical number of bits according to a thermometric type coding, successive values of which can be represented in the form of a first matrix, each row of which is a digital word, comprising:

a first set of gates associated with a first decoding module, the gates of said first set being distributed into similar groups of gates forming logic blocks having k data inputs with each of which is associated a selection input, the number k being equal to a number of so-called triangular sub-matrices extracted from the first matrix and having one dimension which is a sub-multiple of a dimension of the first matrix, and which are aligned along a same diagonal of the first matrix, a second group of gates with single data input, associated with a second decoding module (high significance), which delivers the high significance bits of the binary output coding and selection signals which are applied to the k selection inputs in order to enable the corresponding data inputs of each of the logic blocks and which are necessary in order to obtain the low significance bits of the binary code at the output of the first decoding module.

10. A decoder according to claim 9, wherein the $p^{th}$ selection input of each of the logic blocks receives the selection signal resulting from an exclusive-OR between the order $p.2^{N-M}$ and order $(p-1)2^{N-M}$ bits in the digital word to be transcoded, when the p takes one of values in the interval 2 to $2^M$ (endpoints inclusive), and the selection signal resulting from an exclusive OR with inverting output between the order $2^{N-M}$ and order $2^N$ bits in the digital word to be transcoded, when p is equal to 1, wherein N is defined by the fact that $2^N$ is equal to the number of bits of the digital word to be transcoded (thermometric starting code) and M is defined by the fact that $2^M$ is equal to the number of said sub-matrices present along the same diagonal of the first matrix.

11. A decoder according to claim 10, wherein the number of logic blocks is equal to $2^{N-M}$, and the $p^{th}$ data input of the $i^{th}$ logic block receives the data from the order $(p-1).2^{N-M}+i$ bits in the digital word to be transcoded, for i varying from 1 to $2^{N-M}$.

12. A converter including a decoder according to claim 11 wherein said logic blocks comprise analog gates including amplifiers with multiple inputs receiving differential analog signals, one of said signals being a signal to be measured by comparing said one signal with a plurality of references, each pair of differential signals constituting an analog equivalent of one of the logic signals applied to the data inputs of the logic blocks, wherein each of said analog gates includes means for setting the logic levels of the output signal from said amplifiers and means for storing the logic levels on a single output of said analog gate to which the outputs of the amplifiers are joined, and wherein each analog gate includes selection inputs in order to enable one of the amplifiers, the other amplifiers of said analog gate exhibiting a high-impedance output state.

13. A decoder to claim 10, for the transcoding of data appearing through a cyclic thermometric coding and which decoder comprises logic blocks which are arranged such that their $p^{th}$ data input delivers at output an inverted logic signal when the value of p is even, characterised in that the number of logic blocks is equal to $2^{N-M}-1$, in that the $p^{th}$ data input of the $i^{th}$ logic block receives the data from the order $(p-1).2^{N-M}+i$ bits in the digital word to be transcoded, for i varying from 1 to $2^{N-M}-1$, and in that the order $2^{N-M}$ bit of the second matrix of the intermediate code is obtained at the output of an exclusive-OR gate receiving as input the logic data equal to the order $N-M+1$ and order $N+1$ bits of the binary code which are delivered by the second decoding module.

14. A decoder according to claim 10, for the transcoding of data appearing through an acyclic thermometric coding and which decoder comprises logic blocks which are arranged such that their $p^{th}$ data input delivers as output an inverted logic signal when the value of p is even, characterised in that the number of logic blocks is equal to $2^{N-M}-1$, in that the $p^{th}$ data input of the $i^{th}$ logic block receives the data from the order $(p-1).2^{N-M}+i$ bits in the digital word to be transcoded, for i varying from 1 to $2^{N-M}-1$, and in that the order $2^{N-M}$ bit of the second matrix of the intermediate code is obtained directly through the value of the $N-M+1$ bit in the binary code delivered by the second decoding module.

15. A converter including a decoder according to claim 10 wherein said logic blocks comprise analog gates including amplifiers with multiple inputs receiving differential analog signals, one of said signals being a signal to be measured by comparing said one signal with a plurality of references, each pair of differential signals constituting an analog equivalent of one of the logic signals applied to the data inputs of the logic blocks, wherein each of said analog gates includes means for setting the logic levels of the output signal from said amplifiers and means for storing the logic levels on a single output of said analog gate to which the outputs of the amplifiers are joined, and wherein each analog gate includes selection inputs in order to enable one of the amplifiers, the other amplifiers of said analog gate exhibiting a high-impedance output state.

16. A converter including a decoder according to claim 9 wherein said logic blocks comprise analog gates with multiple inputs receiving differential analog signals on amplifiers, one of said signals being a signal to be measured, said one signal being compared with a plurality of references, each pair of differential signals constituting an analog equivalent of one of the logic signals applied to the data inputs of said logic blocks, in that each of said analog gates includes means for setting the logic levels of the output signal from the said amplifiers and means for storing the logic levels on a single output of said analog gate to which the outputs of the amplifiers are joined, and wherein each analog gate includes selection inputs in order to enable one of the amplifiers, the unselected amplifiers of said gate exhibiting a high-impedance output state.

17. A converter according to claim 16, characterised in that the inputs of the amplifiers of the analog gates are connected to outputs of interpolation networks, which outputs are linked to folding amplifiers.

18. A converter comprising:
a decoder as claimed in claim 9 wherein said decoder logic blocks comprise a plurality of analog gates at least one of which includes first and second differential amplifiers each having a first input for an analog signal to be measured and a second input for a respective analog reference signal, each differential amplifier comparing the analog signal to be measured with its respective analog reference signal, wherein said one analog gate includes means for setting logic levels of the output signal from said amplifiers and means for storing the logic levels at a single output of said analog gate to which the outputs of the amplifiers are joined, and wherein each analog gate includes means for selectively enabling one of said differential amplifiers, and a plurality of selection inputs supplying respective selection signals to said enabling means.

19. A converter as claimed in claim 18 wherein said enabling means comprise; first and second transistor switches each of which is coupled to a respective differential amplifier and each having a control input coupled to a respective selection input, and a current source coupled to each of said transistor switches to control the supply of current to each said transistor switch.

20. A converter as claimed in claim 19 further comprising; a third differential amplifier coupled to a third transistor switch which is controlled by a clock signal, and wherein said current source is coupled to said third transistor switch so as to control the supply of current therein.

* * * * *